United States Patent
Havemann

(10) Patent No.: US 6,372,596 B1
(45) Date of Patent: Apr. 16, 2002

(54) METHOD OF MAKING HORIZONTAL BIPOLAR TRANSISTOR WITH INSULATED BASE STRUCTURE

(75) Inventor: Robert H. Havemann, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/474,239

(22) Filed: Jun. 7, 1995

Related U.S. Application Data

(60) Division of application No. 08/261,313, filed on Jun. 15, 1994, now abandoned, which is a continuation of application No. 07/946,044, filed on Sep. 15, 1992, now abandoned, which is a continuation of application No. 07/523,299, filed on May 14, 1990, now abandoned, which is a continuation of application No. 07/274,628, filed on Nov. 22, 1988, now abandoned, which is a continuation of application No. 07/031,330, filed on Mar. 27, 1997, now abandoned, which is a continuation-in-part of application No. 06/716,297, filed on Mar. 26, 1985, now abandoned, and a continuation-in-part of application No. 06/696,373, filed on Jan. 30, 1985, now abandoned.

(51) Int. Cl.[7] ............................................. H01L 21/331
(52) U.S. Cl. ........................................................ 438/338
(58) Field of Search ........................... 437/32; 438/309, 438/364, 423, 335, 339

(56) References Cited

U.S. PATENT DOCUMENTS

| | | | | |
|---|---|---|---|---|
| T861,057 I4 | * | 4/1969 | Lin | |
| 3,549,432 A | * | 12/1970 | Sivertsen | |
| 3,885,999 A | * | 5/1975 | Fusardi et al. | 148/175 |
| 4,339,767 A | * | 7/1982 | Horng et al. | 357/44 |
| 4,412,868 A | * | 11/1983 | Brown et al. | 148/1.5 |
| 4,492,008 A | * | 1/1985 | Anantha et al. | 29/571 |
| 4,571,609 A | * | 2/1986 | Hatano | 357/41 |
| 4,621,277 A | * | 11/1986 | Ito et al. | 357/54 |
| 4,631,570 A | * | 12/1986 | Birrittella et al. | 357/49 |
| 4,769,687 A | * | 9/1988 | Nakazato et al. | 357/35 |
| 4,829,359 A | * | 5/1989 | O et al. | 257/374 |
| 5,395,771 A | * | 3/1995 | Nakato | 437/24 |
| 5,514,897 A | * | 5/1996 | Nakato | 257/396 |

FOREIGN PATENT DOCUMENTS

| | | | | |
|---|---|---|---|---|
| JP | 5230175 | * | 7/1977 | 357/35 |
| JP | 0241963 | * | 10/1988 | 437/32 |

OTHER PUBLICATIONS

H. H. Berger, "Method . . . Lateral Transistor", IBM Technical Disclosure Bull., vol. 23, No. 3, Aug. 1980.*
K.G. Ashar, "Insulating . . . Transistor", IBM Tech. Dis. Bull., vol. 14, No. 5 Oct. 1971.*

* cited by examiner

*Primary Examiner*—Long Pham
(74) *Attorney, Agent, or Firm*—Wade James Brady, III; Frederick J. Telecky, Jr.

(57) ABSTRACT

In one embodiment of a horizontal bipolar transistor constructed in accordance with the teachings of this invention, oxygen is implanted into the horizontal bipolar transistor to provide a silicon dioxide layer between the base and the collector and emitter of the horizontal bipolar transistor. This silicon dioxide layer reduces the actual interface area of the base to collector and base to emitter junctions, thereby decreasing the capacitance of the transistor. In addition, the dielectric constant of the silicon dioxide layer is such that the capacitance across the silicon dioxide layer, and thus between the base and the collector and emitter, is minimal relative to the base to collector and base to emitter capacitance provided by the base to collector and base to emitter junctions themselves.

In an alternative embodiment, nitrogen ions are implanted to form silicon nitride regions rather than silicon dioxide regions. In another alternative embodiment, nitrogen and oxygen ions are implanted to form both silicon nitride and silicon dioxide rather than either species singularly.

20 Claims, 3 Drawing Sheets

METHOD OF MAKING HORIZONTAL BIPOLAR TRANSISTOR WITH INSULATED BASE STRUCTURE

CROSS-REFERENCE TO RELATED CASE

This application is a Division of application Ser. No. 08/261,313, filed Jun. 15, 1994, now abandoned which is a continuation of Ser. No. 07/946,044, filed Sep. 15, 1992, now abandoned, which is a continuation of Ser. No. 07/523,299, filed May 14, 1990, now abandoned, which is a continuation of Ser. No. 07/274,628, filed Nov. 22, 1988, now abandoned, which is a continuation of Ser. No. 07/031,330, filed Mar. 27, 1987, now abandoned, which is a continuation-in-part of Ser. No. 06/696,373, filed Jan. 30, 1985, now abandoned, and Ser. No. 06/716,297, filed Mar. 26, 1985, now abandoned.

FIELD OF THE INVENTION

The present invention relates to the field of integrated circuit fabrication. Specifically, the present invention relates to a structure and method for fabricating bipolar transistors.

BACKGROUND OF THE INVENTION

One of the properties which inhibits the high frequency and high speed digital operation of bipolar transistors is the capacitive coupling between the base and the collector and emitter of the bipolar transistor. The capacitive coupling occurs across the depletion regions of the respective junctions. This phenomenon is well known and is explained in Sze, PHYSICS OF SEMICONDUCTOR DEVICES, pp. 79–81(1981). Using simple a parallel plate capacitor model, the equation for the capacitance of a junction is $C = K_o A/d$ where, C is the capacitance of the junction, k is the dielectric constant of the material between the "plates" of the capacitor, eo is the permitivity of free space, A is the area of the "plates", and d is the width of the junction depletion region.

Thus the capacitance of a junction is directly proportional to the area of the junction and is inversely proportional to the width of the junction depletion region. Thus, there are three ways of decreasing the capacitance of a junction: decreasing the dielectric constant of the junction material or a portion of the junction, decreasing the area of the junction and increasing the thickness of the junction. Because the active junction must consist of semiconductor material, it is usually impractical to change the dielectric constant of the active junction. Therefore, in order to reduce the capacitance of a junction, the active junction area must be decreased, the effective junction thickness must be increased and/or the dielectric constant of the parasitic junction regions must be decreased.

FIG. 1 is a side view of a prior art horizontal bipolar transistor. An N-type epitaxial layer is formed on substrate 1 and isolation oxide regions 2 are formed in this epitaxial layer. Base region 5, collector region 3 and emitter region 4 are formed in the epitaxial layer. Parasitic capacitances occur between the base and both the collector and the emitter. It is an object of the present invention to minimize these capacitances in a horizontal bipolar transistor.

SUMMARY

In one embodiment of a horizontal bipolar transistor constructed in accordance with the teachings of this invention, oxygen is implanted into the horizontal bipolar transistor to provide a silicon dioxide layer between the base region and both the collector and the emitter of the horizontal bipolar transistor. This silicon dioxide layer reduces the actual interface area of the base to collector and base to emitter junctions, thereby decreasing the capacitance transistor. In addition, the thickness and dielectric constant of the silicon dioxide layer is such that the capacitance across the silicon dioxide layer, and thus between the base and the emitter of collector, is minimal relative to the base to emitter or collector capacitance provided by the base to emitter or collector junction itself because the dielectric constant of silicon dioxide is approximately 3.9 which is much less than the dielectric constant of crystalline silicon which is approximately 11.7.

In an alternative embodiment, nitrogen ions are implanted to form silicon nitride regions rather than silicon dioxide regions.

In yet another alternative embodiment, oxygen and nitrogen ions are implanted to form both silicon nitride and silicon dioxide regions rather than either species alone.

DETAILED DESCRIPTION

Figure 1:
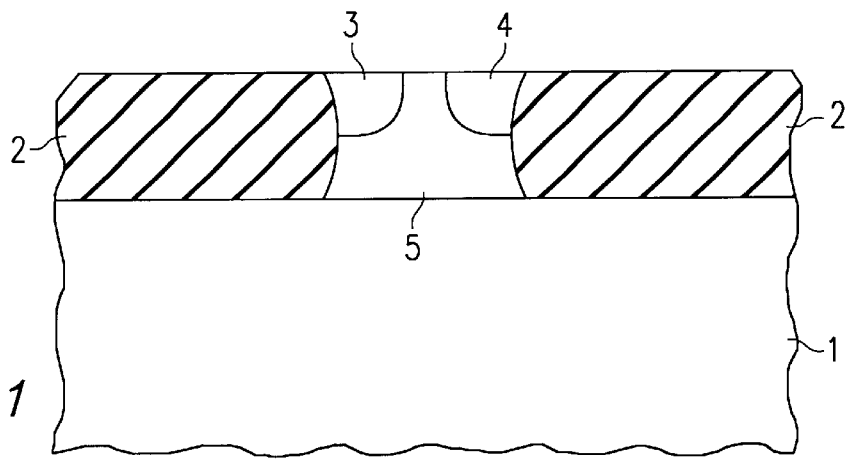
FIG. 1 is a schematic side view showing the construction of the prior art horizontal bipolar transistor.
Figure 2A:
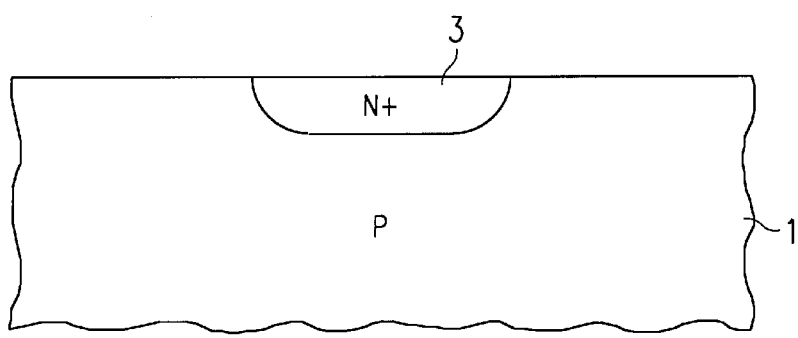
FIGS. 2A–2H are schematic side view drawings depicting the processing steps necessary to construct one embodiment of the present invention.
Figure 2B:
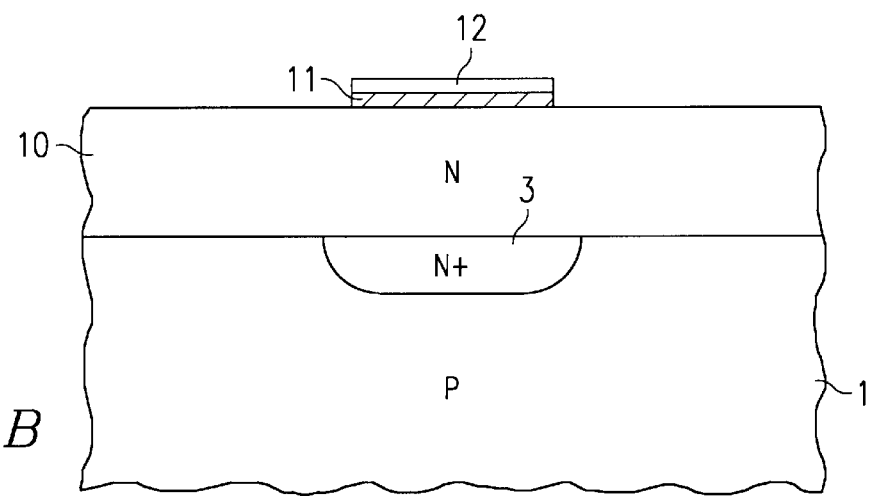
Figure 2C:
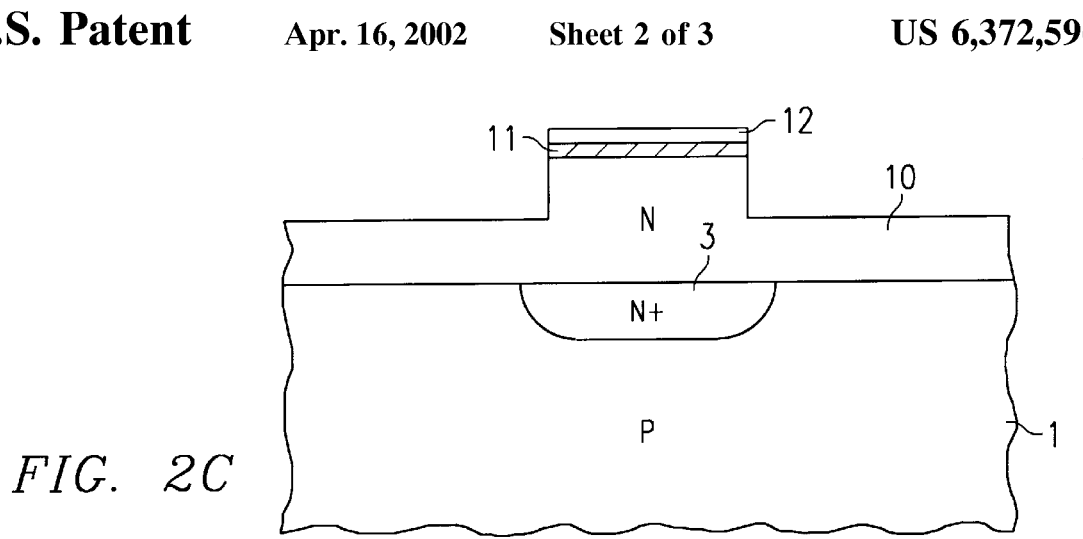
Figure 2D:
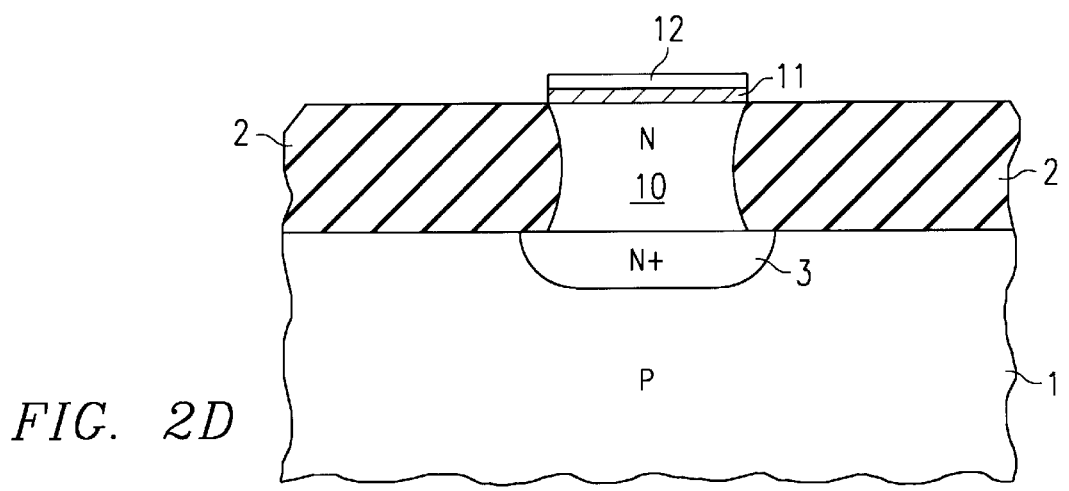
Figure 2E:
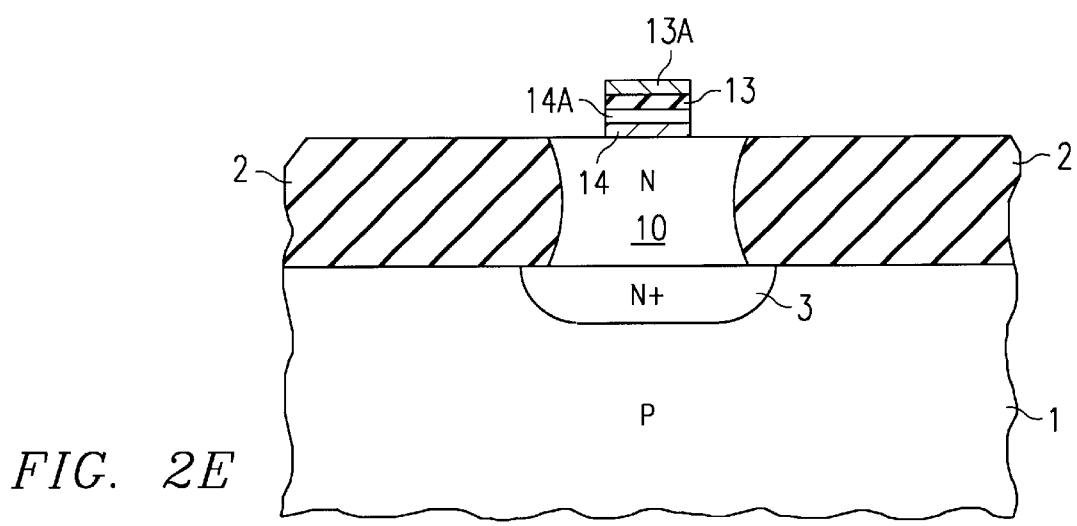

FIGS. 2A–2H are schematic side view drawings showing the processing steps necessary to produce a horizontal bipolar transistor with reduced capacitance in accordance with one embodiment of the present invention. Diffusion region 3 of FIG. 2A is an N+ diffusion formed in P-type substrate 1 using techniques well known in the art. Silicon epitaxial layer 10 of FIG. 2B is formed on the surface of substrate 1 to a thickness of approximately 1 micron using techniques well known in the art. Silicon dioxide layer 11 and silicon nitride layer 12 are formed and patterned on the surface of epitaxial layer 10 using techniques well known in the art. Epitaxial layer 10 is then anisotropically etched to provide the structure shown in FIG. 2C. Silicon dioxide layers 2 of FIG. 2D are then thermally grown in a steam ambient at a temperature of approximately 975 degrees C. for approximately 8 hours. Silicon nitride layer 12 and silicon dioxide layer 11 are then removed using techniques well known in the art. Silicon dioxide layer 14 is then thermally grown to a thickness of 300 to 1500 angstroms, for example, by using an oxygen ambient at a temperature of 950 degrees C. for approximately 30 minutes for a thickness of approximately 300 angstroms. Polycrystalline silicon layer 14A is then formed by chemical vapor deposition to a thickness of approximately 2,000 angstroms. Silicon nitride layer 13 is then formed to a thickness of approximately 2,000 to 3,000 angstroms using chemical vapor deposition. Silicon dioxide layer 13A is then deposited by chemical vapor deposition or plasma deposition to a thickness of 6,000 to 8,000 angstroms. Silicon dioxide layer 13A, silicon nitride layer 13, polycrystalline silicon layer 14A and silicon dioxide layer 14 are then patterned and anisotropically etched using techniques well known in the art. Epitaxial layer 10 is then subjected to an ion implantation of oxygen ions (O2) at an energy of approximately 300 kiloelectron volts and a density of approximately 6E17 ions per centimeter squared. After this oxygen implant, silicon dioxide layer 13A is removed by wet etching in dilute 10% hydroflouric acid which selectively etches undensified silicon dioxide layer 13A without significantly undercutting silicon dioxide layer 14. The oxygen implant will have no effect on isolation regions 2 and after annealing the oxygen ion implant at approximately 1150 degrees C. for approximately two hours, will form silicon dioxide regions 15 of FIG. 2F which are approximately 4000 angstroms below the surface of epitaxial layer 10.

In another embodiment, nitrogen ions ($N_2$) are implanted into epitaxial layer 10 rather than oxygen ions. These nitrogen ions are implanted at an energy of approximately 150 to 200 kiloelectron volts and a density of approximately 5E17 to 1.5E18 ions per centimeter squared to form silicon nitride regions approximately 4000 angstroms below the surface of epitaxial layer 10. When annealed, the nitrogen ions form silicon nitride regions rather than silicon dioxide regions 15. The subsequent processing steps for forming this embodiment are the same for the embodiment which forms silicon dioxide regions.

In a preferred embodiment, Nitrogen ions ($N_2$) and oxygen ions ($O_2$) are sequentially implanted into epitaxial layer 10 rather than oxygen or nitrogen ions alone. This may be accomplished by implanting either species first. The nitrogen ions will be implanted at an energy of 150 to 200 kiloelectron volts and approximately <1E17 ions per centimeter squared to form silicon nitride regions approximately 4000 Å below the surface of the epitaxial layer 10. Oxygen ions can be implanted by subjecting the epitaxial layer 10 to oxygen ions at an energy of 300 kiloelectron volts and a density of approximately 1.4E18–2.2E18 ions per centimeter squared. When annealed the ions form silicon nitride and silicon dioxide. The subsequent processing steps for forming this embodiment are the same as for the silicon nitride and silicon dioxide embodiments.

Other alternative implanted species including but not limited to Carbon and Ammonia can be used to achieve the objects of this invention. Additionally, when Nitrogen implantation is used, annealing in a hydrogen environment can improve material performance.

Figure 2F:
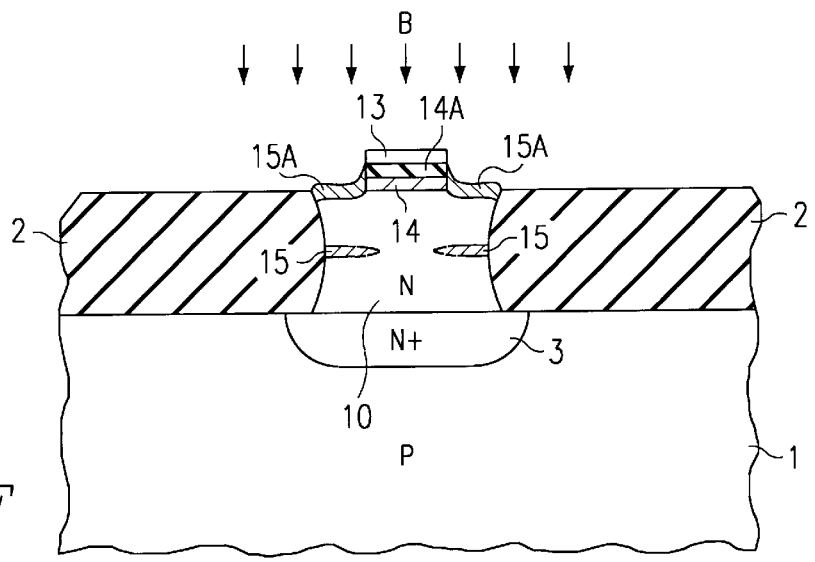
Figure 2G:
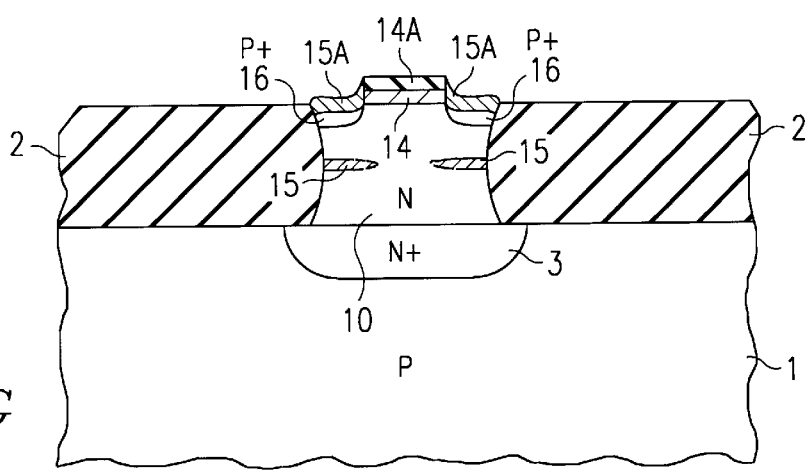
Figure 2H:
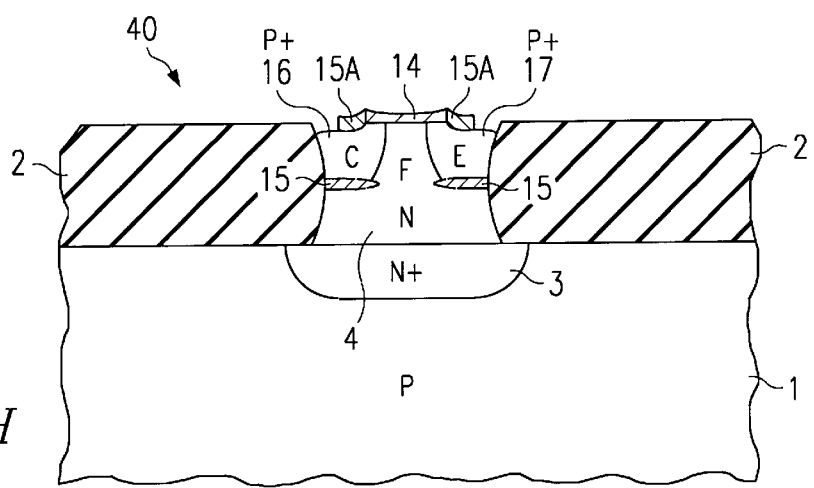

The structure of FIG. 2F is then subjected to a boron ion implantation having an energy of approximately 70 kiloelectron volts and a density of approximately 1E15 ions per centimeter squared. Silicon nitride layer 13 is then removed using a solution of phosphoric acid. The boron ion implantation is then driven in to form P+ regions 16 and 17 of FIG. 2G thus forming collector and emitter regions 16 and 17, respectively on silicon dioxide regions 15 providing an insulated base structure. Polycrystalline silicon layer 14A is then removed by selective wet etching or by selective plasma etching in, for example, a carbon tetraflouride-oxygen plasma. Contacts are then opened to the collector, the emitter and the base (not shown) as shown in FIG. 2H. This structure limits the capacitance between the base and both the collector and emitter by decreasing the interface area between the respective regions and by decreasing the dielectric constant at the extrinsic base collector and base emitter junctions.

TECHNICAL ADVANTAGES

The present invention provides the technical advantage of reducing the base to collector and base to emitter capacitances of horizontal bipolar transistors. This reduction in capacitance allows horizontal bipolar transistors constructed according to the teachings of this invention to increase the frequency of operation of the horizontal bipolar transistors and to increase the speed of operation of the horizontal bipolar transistors when used in digital electronic circuits.

We claim:

1. A method of making a transistor comprising the steps of:
    (a) providing a volume of semiconductor material doped with a dopant of a predetermined conductivity type having a pair of opposed surfaces;
    (b) then forming at least one region of electrically insulating material within said volume, said at least one region of electrically insulating material including a part of said semiconductor material, said at least one region of electrically insulating material being spaced from said pair of opposed surfaces;
    (c) then forming two spaced apart regions in said volume of semiconductor material of conductivity type opposite to said predetermined conductivity type, at least one of said spaced apart regions of opposite conductivity type extending from one of said opposed surfaces to said at least one region of electrically insulating material to provide one of an emitter or collector region between said one of said opposed surfaces and said at least one region of electrically insulating material with the remainder of said volume doped said predetermined conductivity type forming a base region.

2. A method of making a transistor comprising the steps of:
    (a) providing a volume of semiconductor material doped with a dopant of a predetermined conductivity type, said volume having a pair of opposed surfaces;
    (b) then forming a pair of regions of electrically insulating material within said volume, said pair of regions of electrically insulating material including material of said volume, said pair of regions of electrically insulating material being spaced apart from said pair of opposed surfaces;
    (c) then forming spaced apart regions of opposite conductivity type in said volume of semiconductor material extending from one of said opposed surfaces to a different one of said regions of electrically insulating material to provide emitter and collector regions between said one of said opposed surfaces and said regions of electrically insulating material with the remainder of said volume forming a base region.

3. The method of claim 1 further including the steps of providing a substrate of opposite conductivity type having a buried contact region of predetermined conductivity type disposed in a surface portion of said substrate and an electrically insulating layer on said substrate, said volume of semiconductor material being disposed over said substrate and said buried contact and contacting and partially bounded by said electrically insulating layer.

4. The method of claim 1 wherein said volume of semiconductor material is provided by epitaxial deposition.

5. The method of claim 1 wherein said regions of electrically insulating material are silicon dioxide regions.

6. The method of claim 1 wherein said predetermined conductivity type is N-type and said opposite conductivity type is P-type.

7. The method of claim 1 wherein said volume of semiconductor material is monocrystalline silicon and said at least one region of electrically insulating material is a region of silicon dioxide formed by the step of implanting oxygen into said monocrystalline silicon.

8. The method of claim 2 wherein said volume of semiconductor material is provided by epitaxial deposition.

9. The method of claim 2 wherein said regions of electrically insulating material are silicon dioxide regions.

10. The method of claim 2 wherein said predetermined conductivity type is N-type and said opposite conductivity type is P-type.

11. The method of claim 2 wherein said buried contact region is doped to have a higher impurity concentration than that of said volume of semiconductor material.

12. The method of claim 2 wherein said semiconductor material is silicon and wherein said regions of electrically insulating material are formed by the step of implanting oxygen into said crystalline silicon.

13. The method of claim 2 wherein said step of forming two spaced apart regions of opposite conductivity type in said volume of semiconductor material includes the steps of implanting an impurity in said volume between said region of electrically insulating material and one of said surfaces and then driving said impurity toward said region of electrically insulating material.

14. The method of claim 3 wherein said step of forming two spaced apart regions of opposite conductivity type in said volume of semiconductor material includes the steps of implanting an impurity in said volume between said region of electrically insulating material and one of said surfaces and then and then driving said impurity toward said region of electrically insulating material.

15. The method of claim 1 wherein said semiconductor material is silicon and wherein said regions of electrically insulating material are formed by the step of implanting nitrogen into said crystalline silicon.

16. The method of claim 2 wherein said semiconductor material is silicon and wherein said regions of electrically insulating material are formed by the step of implanting nitrogen into said crystalline silicon.

17. A method of making a transistor comprising the steps of:

(a) providing a volume of semiconductor material doped with a dopant of a predetermined conductivity type, said volume having a pair of opposed surfaces;

(b) then forming a pair of regions of electrically insulating material within said volume, said pair of regions of electrically insulating material including material of said volume, said pair of regions of electrically insulating material being spaced apart from said pair of opposed surfaces;

(c) then forming spaced apart regions of opposite conductivity type in said volume of semiconductor material extending from one of said opposed surfaces to a different one of said regions of electrically insulating material to provide emitter and collector regions between said one of said opposed surfaces and said regions of electrically insulating material with the remainder of said volume forming a base region and extending to said one of said opposed surfaces.

18. The method of claim 17 wherein said step of forming a pair of regions of electrically insulating material within said volume is provided by the step of implanting one of oxygen and nitrogen ions into said volume of semiconductor material.

19. The method of claim 17 wherein said step of forming spaced apart regions of opposite conductivity type in said volume of semiconductor material comprises the steps of implanting a dopant of conductivity type opposite to said predetermined conductivity type at a pair of spaced apart regions between one of said opposed surfaces and one of said regions of electrically insulating material and then driving said dopant toward a said region of electrically insulating material to form a pair of spaced apart regions of said opposite conductivity type.

20. The method of claim 18 wherein said step of forming spaced apart regions of opposite conductivity type in said volume of semiconductor material comprises the steps of implanting a dopant of conductivity type opposite to said predetermined conductivity type at a pair of spaced apart regions between one of said opposed surfaces and one of said regions of electrically insulating material and then driving said dopant toward a said region of electrically insulating material to form a pair of spaced apart regions of said opposite conductivity type.

* * * * *